United States Patent [19]

Kemeny et al.

[11] Patent Number: 5,890,798
[45] Date of Patent: *Apr. 6, 1999

[54] COMPUTER-CONTROLLED MASTER REPRODUCER FOR DEPOSITING A MASTER REPRODUCTION ON A SUBSTRATE, METHOD FOR DEPOSITING THE SAME, AND MASTER REPRODUCTION

[75] Inventors: Matthias D. Kemeny, Portland, Oreg.; Edo Ziring, Mercer Island, Wash.

[73] Assignee: Advanced Electro Mechanical, L.L.C., Mercer Island, Wash.

[*] Notice: The term of this patent shall not extend beyond the expiration date of Pat. No. 5,689,426.

[21] Appl. No.: 943,065

[22] Filed: Oct. 2, 1997

Related U.S. Application Data

[63] Continuation of Ser. No. 453,145, May 30, 1995, Pat. No. 5,689,426.

[51] Int. Cl.$^6$ ............................................. G06F 19/00
[52] U.S. Cl. ............................ 364/473.01; 364/474.24; 364/473.02
[58] Field of Search .................. 364/473.01–473.03, 364/474.24; 358/294; 106/25; 264/220

[56] References Cited

U.S. PATENT DOCUMENTS

| | | | |
|---|---|---|---|
| 3,911,195 | 10/1975 | Schmidt et al. | 428/317.9 |
| 4,017,581 | 4/1977 | Amidon | 264/220 |
| 4,248,746 | 2/1981 | Greiner | 524/563 |
| 4,792,859 | 12/1988 | Wicker et al. | 358/294 |
| 5,006,170 | 4/1991 | Schwarz et al. | 106/31.3 |
| 5,006,172 | 4/1991 | Chieng et al. | 106/31.49 |
| 5,019,202 | 5/1991 | Kawahata et al. | 156/277 |
| 5,112,398 | 5/1992 | Kruse | 106/20 |
| 5,122,187 | 6/1992 | Schwarz et al. | 106/31.29 |
| 5,134,569 | 7/1992 | Masters | 364/474.24 |
| 5,144,479 | 9/1992 | Keaveney et al. | 359/424 |
| 5,204,055 | 4/1993 | Sachs et al. | 419/2 |
| 5,216,616 | 6/1993 | Masters | 364/474.24 |
| 5,250,121 | 10/1993 | Yamamoto et al. | 264/401 |
| 5,264,275 | 11/1993 | Misuda et al. | 428/304.4 |
| 5,268,704 | 12/1993 | Hasegawa et al. | 347/216 |

*Primary Examiner*—Reba I. Elmore
*Assistant Examiner*—Sheela S. Rao
*Attorney, Agent, or Firm*—Kolisch, Hartwell, Dickinson, McCormack & Heuser

[57] ABSTRACT

A computer-controlled master reproducer for depositing a master reproduction on a substrate includes a master source containing in machine-readable format one or more masters each having a shape characteristic and a color characteristic. Also included is a curable-material source, and gun structure interconnected with the curable-material source for shooting the curable material toward the substrate to deposit the master reproduction on it. The gun structure is constructed to shoot the curable material in microdroplet form to deposit discrete dots of curable material on the substrate. Orientation structure is also included for orienting the gun structure with respect to the substrate, and a computer controller is in communication with the above components. Other features of the master reproducer include master-obtaining structure which may include one or all of the following: (1) a scanner constructed for scanning an image such as a photograph and storing the scanned image in a machine-readable format, (2) a CAD device to allow for a user-designed master, and (3) a modem for communication with another master source. The master reproducer may also include a curing device, such as a pulsating UV laser, for curing the curable-material after it is deposited on the substrate. The gun structure deposits the master reproduction on the substrate in a form that allows the entire master reproduction to be removed from the substrate in one piece after the curable material has cured. Other aspects of the invention include a master reproduction with a body formed using the above-described master reproducer, and a method of depositing a master reproduction on a substrate in a form that allows for removal of the master reproduction in one piece.

10 Claims, 2 Drawing Sheets

COMPUTER-CONTROLLED MASTER REPRODUCER FOR DEPOSITING A MASTER REPRODUCTION ON A SUBSTRATE, METHOD FOR DEPOSITING THE SAME, AND MASTER REPRODUCTION

This is a continuation of application Ser. No. 08/453,145, filed May 30, 1995 now U.S. Pat. No. 5,689,426.

BACKGROUND AND SUMMARY OF THE INVENTION

The present invention relates generally to the display, advertising and sign industries, and to related processes of forming display lettering such as that process known as a vinyl transfer process. More particularly, the invention concerns a novel computer-controlled master reproducer for depositing a master reproduction on a substrate.

The display, advertising and sign industries presently utilize a vinyl-transfer method for generating desired patterns and forms such as lettering. The process is a labor-intensive one that involves placing or stamping a desired pattern into a sheet of dry, adhesive-backed vinyl film that is positioned on a substrate. After stamping the pattern in the sheet, and then cutting the same from the sheet, an arduous process known as weeding is performed. Weeding involves manually removing undesired areas of the sheet that do not form part of the now-present pattern. Next, the cut and weeded pattern is transferred to a desired surface and positioned by rolling or other suitable methods to produce the desired display.

Using such a process, desired vinyl lettering is applied to, for example, an office or vehicle door to identify a business name.

In addition to labor and time limitations, the conventional vinyl-transfer process is limited generally to solid-color applications, and to size and material specifications of commercially available sheets of vinyl stock.

Until now, there has not been proposed a system that overcomes the above drawbacks of the conventional vinyl-transfer method.

Accordingly, it is a principal object of the present invention to provide a system for depositing a desired pattern which overcomes the drawbacks of prior-art proposals.

Another object is to provide such a system that allows for deposition of a desired colored film on a surface in a tightly controlled location and a uniform thickness.

Yet another object is to provide such a system that does not require the steps of cutting and weeding that are required by the conventional vinyl-transfer method.

Another important object of the invention is to provide such a system that is capable of producing final desired shapes or forms on carrier material to be placed on and bonded to a desired surface location such as an office door.

It is also an object of the invention to provide such a system that can be cost-effectively manufactured.

In brief summary, one aspect of the invention includes a computer-controlled master reproducer for depositing a master reproduction on a substrate. The invention includes a master source containing in a machine-readable format one or more masters each having a shape characteristic and a color characteristic. Also included is a curable-material source, and gun structure interconnected with the curable-material source for shooting the curable material toward the substrate to deposit the master reproduction on it. The gun structure is constructed to shoot the curable material in microdroplet form to deposit curable material on the substrate, preferably in the form of discrete dots of that material.

The master reproducer aspect of the invention also includes orientation structure for orienting the gun structure with respect to the substrate, and a computer controller in communication with the master source, the curable-material source, the gun structure, and the orientation structure. The computer controller includes a set of control instructions for (1) reading the master and, based upon that reading, (2) for transfering the curable material from the curable-material source to the gun structure, and (3) for causing the gun structure to shoot the curable material at the substrate to deposit the master reproduction on such substrate.

Other features of the master reproducer include master-obtaining structure in communication with the master source. The master-obtaining structure may include one or all of the following: (1) a scanner constructed for scanning an image such as a photograph and storing the scanned image in a machine-readable format, (2) a CAD device to allow for a user-designed master, and (3) a modem for communication with another master source.

The master reproducer of the invention may also include a curing device, such as a pulsating UV source, for curing the curable-material after it is deposited on the substrate. Preferably, the UV source is a UV laser. There may also be plural containers of curable material, each containing a different colored curable material, and the gun structure would then include plural nozzles, one nozzle for each container. For that version, the computer controller includes a set of control instructions for color-specific transfering of curable material to the appropriate nozzle based upon the reading of the color characteristic of the master, thereby to deposit a preselected color of the master reproduction on the substrate.

The gun structure deposits the master reproduction on the substrate in a form that allows the entire master reproduction to be removed from the substrate in one piece after the curable material has cured.

The master reproducer may also include an adhesive source and adhesive-conduit structure for connecting the adhesive source to the gun structure. In that way, adhesive may be delivered to the gun structure via the adhesive-conduit structure, and shot at the substrate to adhere the to-be-deposited master reproduction to the same.

Other aspects of the invention include a master reproduction with a body formed using the above-described master reproducer, and a method of depositing a master reproduction on a substrate in a form that allows for removal of the master reproduction in one piece.

These and other objects and advantages of the invention will be more clearly understood from a consideration of the accompanying drawings and the following description of the preferred embodiment.

DETAILED DESCRIPTION OF THE PREFERRED EMBODIMENT

Figure 4:
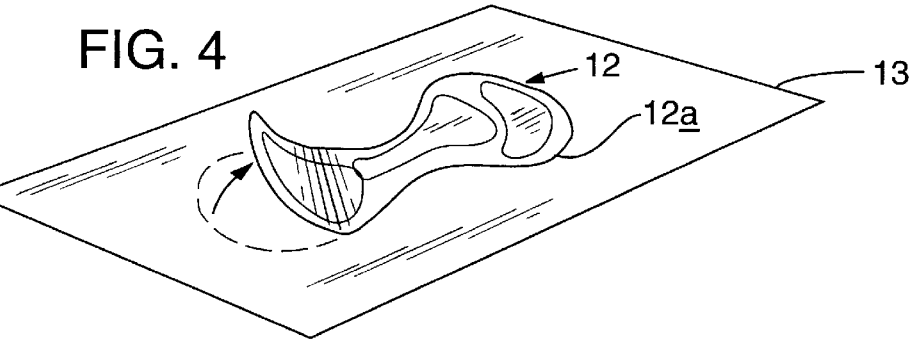
FIG. 4 is an isometric, schematic view of a representative master reproduction that is reproducible using the master reproducer of the present invention.
Figure 5:
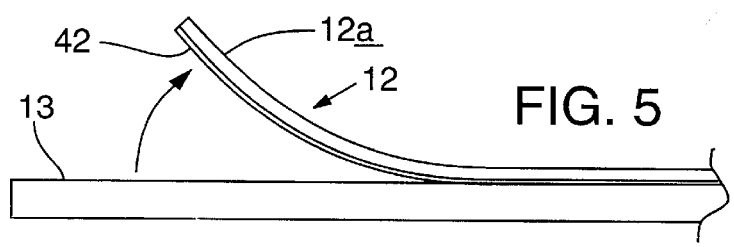
FIG. 5 is a side elevational view of the master reproduction shown in FIG. 4.

Referring to FIGS. 1–3 and 6, the computer-controlled master reproducer of the present invention is shown according to its preferred embodiment and indicated generally at 10. Master reproducer 10 is for depositing on a substrate a master reproduction such as the reproduction, shown schematically at 12 in FIGS. 4–5, on a substrate 13. Master reproduction 12 has a body 12a. As will be described, master reproducer 10 deposits the master reproduction on the substrate in a form that allows the entire master reproduction to be removed from the substrate in one piece after the curable material has cured.

Figure 1:
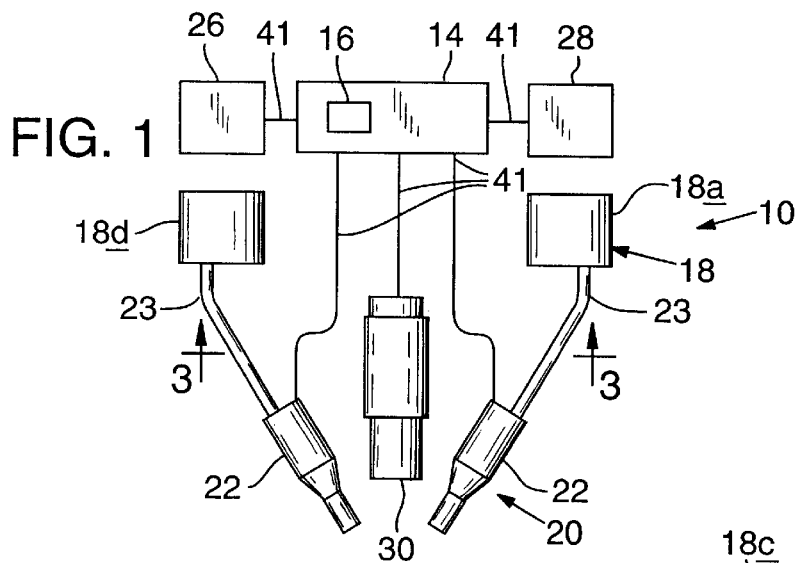
FIG. 1 is a side elevational, partially schematic view of the master reproducer of the invention.
Figure 6:
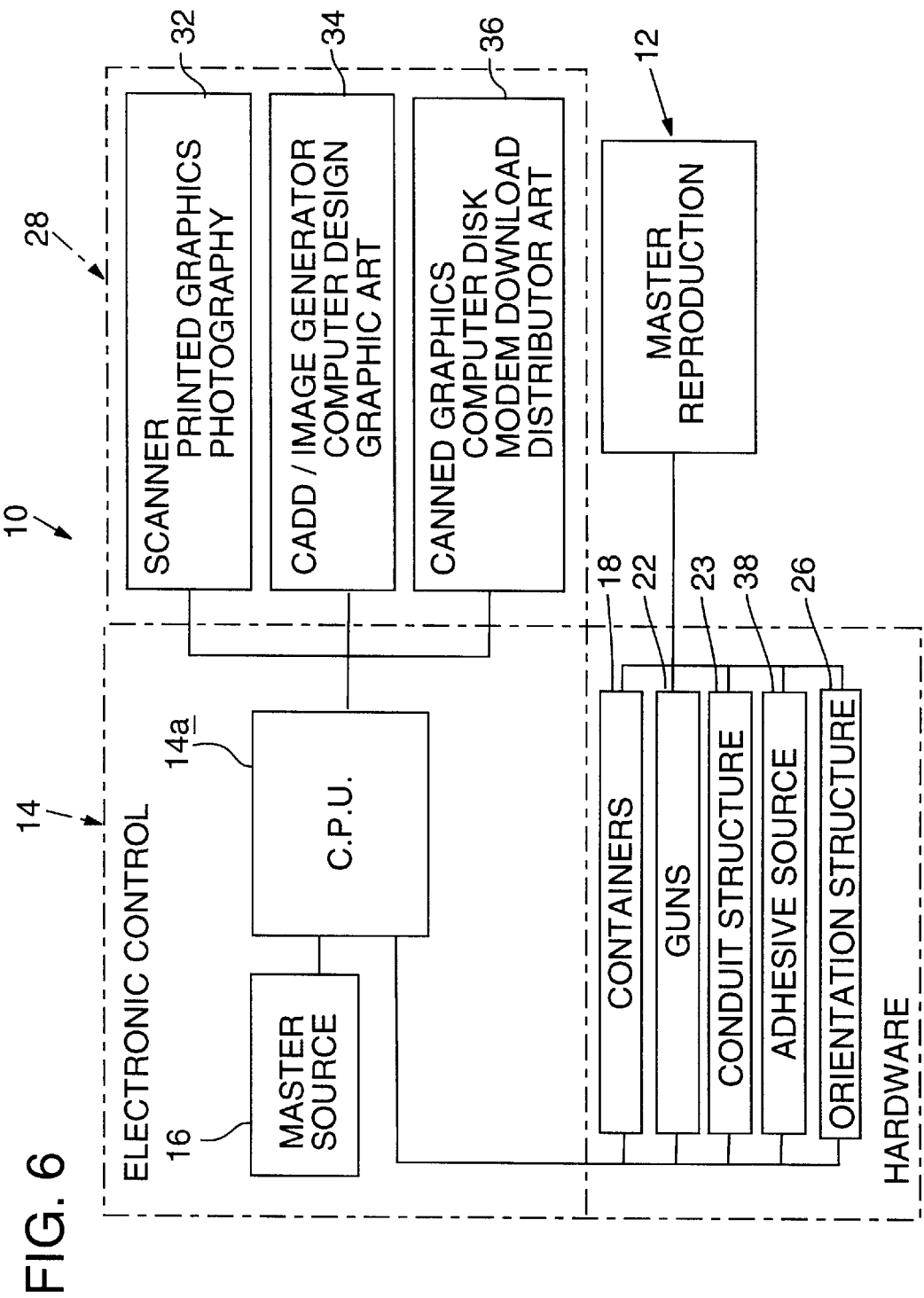
FIG. 6 is a schematic block diagram illustrating the operational components of the master reproducer of the invention.

Referring to FIGS. 1 and 6, master reproducer 10 includes a computer controller 14, including a suitable CPU 14a and a master source 16 which is preferably in the form of digitized, or otherwise machine-readable, information stored in a suitable computer memory in controller 14. Master source 16 contains one or more masters each having shape and color characteristics.

The term master is meant to include any desired image, pattern, form or representation. For illustrative purposes, one such master may be the letter "K". The following description will refer at times to this letter to provide the reader with a visual reference for a master.

Figure 3:
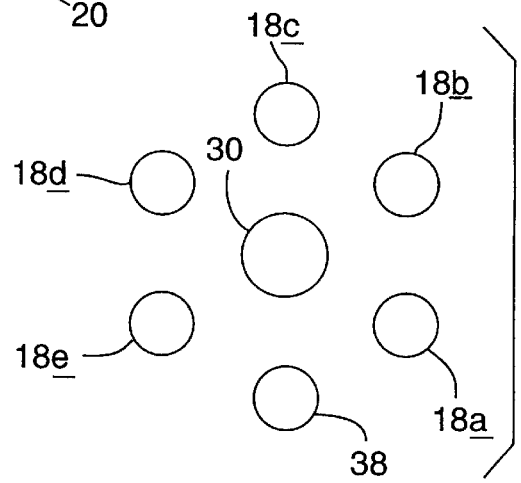
FIG. 3 is a schematic view of FIG. 1 generally through line 3—3.

Still referring to FIG. 1, a curable-material source 18 preferably takes the form of containers, such as containers 18a–b each holding a desired type of curable material such as liquid vinyl. Any suitable polymeric or otherwise curable coating material, including powder coatings, may be used. Referring to FIG. 3, and as will be described, master source 18 preferably includes plural containers 18a–e of desired colors of curable material for a four color process. Those colors are black, magenta, yellow, and cyan.

FIG. 1 also shows that master reporducer 10 includes gun structure 20, preferably made up of plural guns, or nozzles, 22 each interconnected with curable-material-source-holding containers 18. Guns 22 are for shooting the curable material toward a substrate or carrier material such as substrate 13 in FIGS. 4–5. The guns will deposit the master reproduction on the substrate, and they are suitably constructed to shoot the curable material in microdroplet form to deposit discrete dots of the same on the substrate. As will be further described, the substrate could be reusable, and examples of suitable material are rolled siliconized paper, high molecular weight polyethylene, TEFLONÔ plastic material, or any other material providing a stable surface that can be indexed. There is also fluid-conveying conduit structure 23 preferably being constructed with separate tubes to connect each container to a corresponding nozzle.

Also, containers 18a–e have associated with them transfer structure such as a suitable pump which is in communication with computer controller 14 for moving the curable-material from the containers to the corresponding guns via the fluid-conveying conduit structure 23.

Completing the description of FIG. 1, master reproducer 10 also includes orientation structure 26, master-obtaining structure 28 and curing device 30.

Orientation structure is shown schematically at 26, and it is for orienting the gun structure with respect to such substrate. It is presently contemplated that orientation structure 26 may take any suitable form of performing such orientation, and may include the usual CAD/CAM motion gantries, or other devices for controlling relative movement of guns 22 and/or substrate 13.

Master-obtaining structure 28 is shown schematically in FIG. 6, and it may include one or all of the following: (1) a scanner 32 suitably constructed for scanning an image such as a photograph and storing the scanned image in a machine-readable format, (2) a CAD, device 34 to allow for a user-designed master, and (3) a modem 36 for communication with another master source to obtain canned graphics, distributor art, or other desired masters.

Curing device 30 is preferably in the form of a pulsating-UV laser which is constructed for curing each dot of curable material deposited on such substrate. Curing device 30 is preferably constructed for delivering a curing fluid to the substrate after deposition of the master reproduction.

Figure 2:
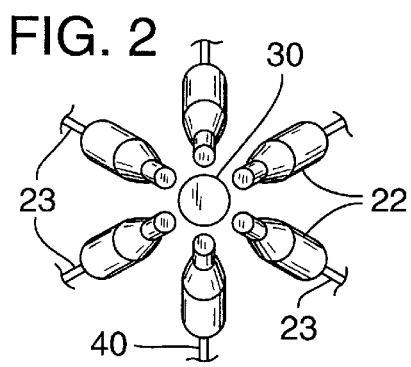
FIG. 2 is a fragmentary, bottom view of the master reproducer of the invention.

Referring to FIGS. 2–3, and for reasons to be described, master reproducer 10 also preferably includes an adhesive source 38 and adhesive-conduit structure 40 for connecting adhesive source 38 to one of guns 22.

Referring to FIGS. 1 and 6, computer controller 14 is in communication, via suitable conductors 41, with computer memory/master source 16, containers/curable-material source 18, guns 22, and orientation structure 26. The computer controller includes a suitable computer program or set of programs with a set of control instructions for reading the master and, based upon that reading, for transfering the curable material from the curable-material source to the gun structure, and for causing the gun structure to shoot the curable material at the substrate to deposit the master reproduction on such substrate. Preferably, that set of instructions also includes a set of control instructions for colorspecific transfering of curable material to the appropriate nozzle 22 based upon the reading of the color characteristic of the master, thereby to deposit a preselected color of the master reproduction on the substrate.

In addition, the instructions in the computer program(s) include a set of instructions for sending control signals to select a desired adhesive from adhesive source 38, to send the desired adhesive to one of guns 22 via adhesive-conduit structure 40, and to shoot the desired adhesive at the substrate either after a suitable, preselected time period in which the curable material is cured, or before the curable material is shot at the substrate. The result is to deposit an adhesive layer, like layer 42 shown in FIG. 5, on the master reproduction for adhering the same to a substrate different from substrate 13, i.e. to the surface on which the user ultimately desires to deposit the master reproduction. In other words, the office door on which the letter "K" is placed.

It is also preferred that the instructions in the computer program(s) include a set of instructions for changing the image-to-size ratio.

Using master reproducer 10, it is proposed to deposit on a substrate a master reproduction with a body having a thickness in the range of between about 2–8 mils. With respect to curable-material source 18, it is also contemplated that a selection of different types of curable materials could be held in containers like containers 18a–e. For example, any suitable liquid vinyl, acrylic material, or powder coating could be used.

The preferred material choice for gun structure 20 is a non-corrosive material such as stainless steel. Gun structure 20 could be any suitable configuration including a linear arrangement of plural guns. Orientation structure 26 may include the usual mechanisms for relating the to-be-deposited master reproduction to a reference point on the substrate. Examples of such mechanisms include pin registration, perforation detectors, sprocket registration of the substrate, or self-registering nozzles that self-register by including a sensor that senses the relative location of the nozzle and a metallic dot of material that is located on the substrate.

With respect to curable materials, master reproducer 10 may also be constructed for two-part curable materials, i.e. a resin and a catalyst. In that version, the resin and catalyst would be held in separate containers with fluid-conveying conduit structure interconnecting each container to a common gun. Suitable heating elements could also be added to provide a capability of heating curable materials to desired temperatures for material-handling reasons such as to lower or optimize viscosity.

Similar to the construction of master reproducer 10 for two-part curable materials, that same construction allows for mixing of desired colors of material in the gun. In that type of arrangement, there would of course be a flushing step to clean the gun after use.

Another option would be to substitute for liquid curable materials suitable charged polymeric microbeads, or microparticles, in preselected colors. Such charged microbeads could be made of polystyrene or polypropylene polymers. If used, containers 18, guns 22 and conduit structure 23 would have to be suitably modified to accomodate such microbeads instead of liquid curable material. Essentially, the idea is that any suitable color carrier, whether liquid or solid, could be used in the master reproducer of the present invention. If microbeads are used as the color carrier, then conventional technology could be used to orient the microbeads relative to each other and adhere them to the substrate.

With respect to depositing the adhesive, the set of computer control instructions preferably allow for a choice of depositing the adhesive first and then the master reproduction, or vice versa. For the latter, a mirror image of the master could be deposited if desired so that the top of the master reproduction when positioned on a substrate/carrier material could be used as the bottom of the master reproduction for purposes of subsequently applying it to its ultimate location, e.g. an office door.

Operation and Preferred Method of Practicing the Invention

Master reproducer 10 can be used to practice the method of the invention by depositing master reproduction 12 on substrate 13 in a form that allows for removal of the master reproduction in one piece. The method includes selecting from master source 16 a master in a machine-readable format and having shape and color characteristics, and choosing from curable-material source 18 a curable material in preselected colors for forming a master reproduction such as master reproduction 12. The method also includes shooting the curable material toward the substrate in a suitable microdroplet form so that discrete dots of curable material are deposited on the substrate, and utilizing a set of control instructions for reading the selected master and, based upon that reading, initiating the shooting of chosen curable material at the substrate to deposit the master reproduction on such substrate. By depositing discrete dots of material on the substrate, the method is effective to reproduce the master according to desired color specifications.

The present invention therefore achieves the above objects by providing a master reproducer that provides a system for depositing a desired pattern which overcomes the drawbacks of prior-art proposals. Master reproducer allows for deposition of a desired master reproduction, such as a colored film in the shape of the letter "K", on a surface in a tightly controlled location and a uniform thickness. Master reproducer 10 also provides a system that does not require the steps of cutting and weeding that are required by the conventional vinyl-transfer method. In addition, master reproducer 10 provides a system that is capable of producing final desired shapes or forms on carrier material to be placed on and bonded to a desired surface location such as an office door. It is also contemplated that master reproducer 10 can be cost-effectively manufactured.

Accordingly, while a preferred embodiment of the invention has been described herein, it is appreciated that modifications are possible that are within the scope of the invention.

It is claimed and desired to secure by Letters Patent:

1. A computer-controlled master reproducer for depositing a master reproduction on a substrate, comprising:

a master source containing a master in a machine-readable format, and having a shape characteristic and a color characteristic;

a curable-material source;

gun structure interconnected with the curable-material source for shooting the curable material toward such substrate to deposit the master reproduction on such substrate, the gun structure being constructed to shoot the curable material in microdroplet form to deposit curable material on the substrate;

orientation structure for orienting the gun structure with respect to such substrate; and a computer controller in communication with the master source, the curable-material source, the gun structure, and the orientation structure, the computer controller including a set of control instructions for reading the master and, based upon that reading, for transferring the curable material from the curable-material source to the gun structure, and for causing the gun structure to shoot the curable material at the substrate to deposit the master reproduction on such substrate.

2. The master reproducer of claim 1 wherein the master source includes plural masters, and the computer controller includes a set of instructions for selecting one of the masters.

3. The master reproducer of claim 2 further including master-obtaining structure in communication with the master source.

4. The master reproducer of claim 3 wherein the master-obtaining structure includes a scanner constructed for scanning an image and storing the scanned image in a machine-readable format.

5. The master reproducer of claim 3 wherein the master-obtaining, structure includes a CAD device to allow for a user-designed master, and a modem for communication with another master source.

6. The master reproducer of claim 3 wherein the master-obtaining structure includes a scanner constructed for scanning an image and storing the scanned image in a machine-readable format, a CAD device to allow for a user-designed master, and a modem for communication with another master source.

7. The master reproducer of claim 1 further including a curing device for curing the curable-material after the curable material is deposited on such substrate.

8. The master reproducer of claim 7 wherein the curing device is a pulsating-UV laser which is constructed for curing each dot of curable material deposited on such substrate.

9. The master reproducer of claim 7 wherein the curing, device is constructed for delivering a curing fluid to the substrate after deposition of the master reproduction.

10. A master reproduction, comprising:
 a body formed using the master reproducer according to claim 1.

* * * * *